US012648366B2

(12) United States Patent
Yeh et al.

(10) Patent No.: US 12,648,366 B2
(45) Date of Patent: Jun. 2, 2026

(54) METHOD FOR MANUFACTURING SUPERCONDUCTIVE QUBIT DEVICE

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Yu-Chen Yeh, Tainan City (TW); Chi-Te Liang, Taipei City (TW); Hsi-Sheng Goan, Taipei City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 866 days.

(21) Appl. No.: 17/715,897

(22) Filed: Apr. 7, 2022

(65) Prior Publication Data

US 2023/0136676 A1 May 4, 2023

Related U.S. Application Data

(60) Provisional application No. 63/275,075, filed on Nov. 3, 2021.

(51) Int. Cl.
*H10N 60/10* (2023.01)
*G06N 10/40* (2022.01)
(Continued)

(52) U.S. Cl.
CPC ........... *H10N 60/128* (2023.02); *G06N 10/40* (2022.01); *H01P 7/08* (2013.01); *H10N 60/01* (2023.02); *H10N 60/11* (2023.02); *H10N 60/855* (2023.02)

(58) Field of Classification Search
CPC ...... H10N 60/128; H10N 60/01; H10N 60/11; H10N 60/855; G06N 10/40; G06N 10/00; H01P 7/08
See application file for complete search history.

(56) References Cited

U.S. PATENT DOCUMENTS

| | | | |
|---|---|---|---|
| 5,430,013 A * | 7/1995 | Inada ................... | H10N 60/128 505/703 |
| 2002/0130393 A1* | 9/2002 | Takayanagi .......... | H10D 84/038 438/933 |

(Continued)

FOREIGN PATENT DOCUMENTS

| CN | 105280718 A * | 1/2016 | ......... H01L 29/0649 |
|---|---|---|---|

OTHER PUBLICATIONS

Deng; Hao, CN-105280718-A, Machine Translation (Year: 2016).*

(Continued)

*Primary Examiner* — Jacob Y Choi
*Assistant Examiner* — Grace Cha
(74) *Attorney, Agent, or Firm* — Maschoff Brennan

(57) ABSTRACT

A device includes a source region, a drain region, a channel region, a pair of depletion gates, an accumulation gate, and a superconductive resonator. The channel region is between the source region and the drain region. The pair of depletion gates are spaced apart from each other. The pair of depletion gates both overlap the channel region and define a quantum dot qubit region in the channel region and between the pair of depletion gates. The accumulation gate is above and crossing the pair of depletion gates. The superconductive resonator is laterally adjacent the quantum dot qubit region.

20 Claims, 17 Drawing Sheets

(51) Int. Cl.
    *H01P 7/08*         (2006.01)
    *H10N 60/01*      (2023.01)
    *H10N 60/85*      (2023.01)

(56)             References Cited

U.S. PATENT DOCUMENTS

| | | | |
|---|---|---|---|
| 2002/0179897 A1* | 12/2002 | Eriksson | H10D 48/3835 |
| | | | 257/14 |
| 2005/0021927 A1* | 1/2005 | Machida | B82Y 10/00 |
| | | | 712/34 |
| 2015/0380129 A1* | 12/2015 | Xue | H10N 60/85 |
| | | | 174/125.1 |
| 2019/0334020 A1 | 10/2019 | Amin et al. | |
| 2020/0243601 A1 | 7/2020 | Orcutt et al. | |
| 2020/0388745 A1* | 12/2020 | Deng | H10N 60/12 |

OTHER PUBLICATIONS

Jarryd J. Pla et al., "High-fidelity readout and control of a nuclear spin qubit in silicon", Nature, vol. 496, Apr. 2013.
Jarryd J. Pla et al., "A single-atom electron spin qubit in silicon", Nature, vol. 489, Sep. 2012.
M. Veldhorst et al., "An addressable quantum dot qubit with fault-tolerant control-fidelity", Nature Nanotechnology, vol. 9, Dec. 2014.

* cited by examiner

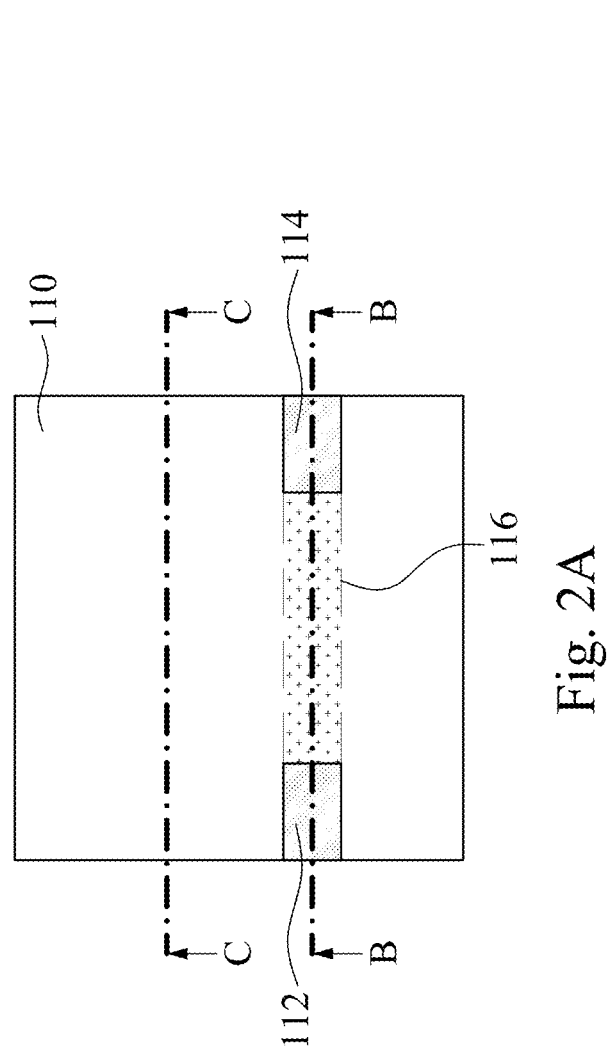
Fig. 2A
Fig. 2C
Fig. 2B

100a

100c

100d

METHOD FOR MANUFACTURING SUPERCONDUCTIVE QUBIT DEVICE

PRIORITY CLAIM AND CROSS-REFERENCE

This application claims priority to U.S. Provisional Application Ser. Number 63/275,075, filed Nov. 3, 2021, which is herein incorporated by reference.

BACKGROUND

Quantum computing refers to the field of research related to computation systems that use quantum mechanical phenomena to manipulate data. On the roadmap towards building a scalable, silicon-based quantum computer, several milestones have already been achieved. Quantum computing may involve initializing states of N qubits (quantum bits), creating controlled entanglements among them, allowing these states to evolve, and reading out the states of the qubits after the evolution. A qubit is a system having two degenerate (i.e., of equal energy) quantum states, with a non-zero probability of being found in either state. Thus, N qubits can define an initial state that is a combination of $2^N$ classical states.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-8C illustrate top views and cross-sectional views of intermediate stages in the formation of an electronic device in accordance with some embodiments of the present disclosure.

FIGS. 10A-14C illustrate top views and cross-sectional views of intermediate stages in the formation of an electronic device in accordance with some embodiments of the present disclosure.

DETAILED DESCRIPTION

Figure 1A:
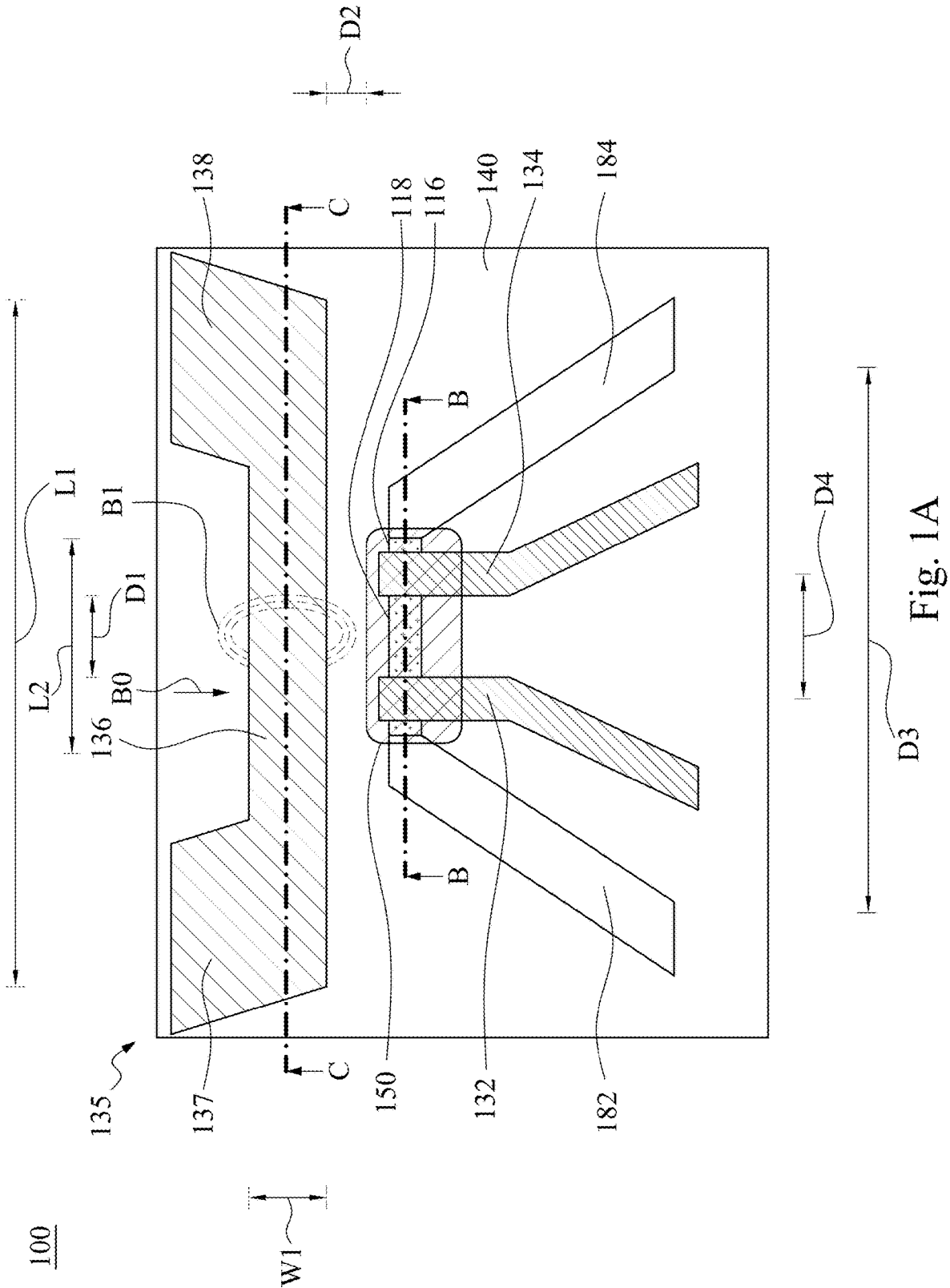
FIG. 1A is a top view of an electronic device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The embodiments of the present disclosure provide a semiconductive qubit device having a superconductive resonator adjacent a quantum dot qubit region to implement a qubit with high efficiency and low thermal heating. The qubit is configured for the control and readout of a spin of a single carrier (electron or hole) in a (semiconductor) substrate. In some embodiments, a transistor used in the qubit may be realized on the device selected from the group including planar devices, multi-gate devices, FinFETs, nanosheet-gate FETs, and gate-all-around FETs.

Figure 1B:
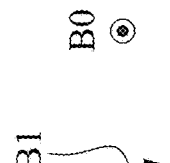
FIG. 1B is a cross-sectional view of the electronic device of FIG. 1A along line B-B.
Figure 1B:
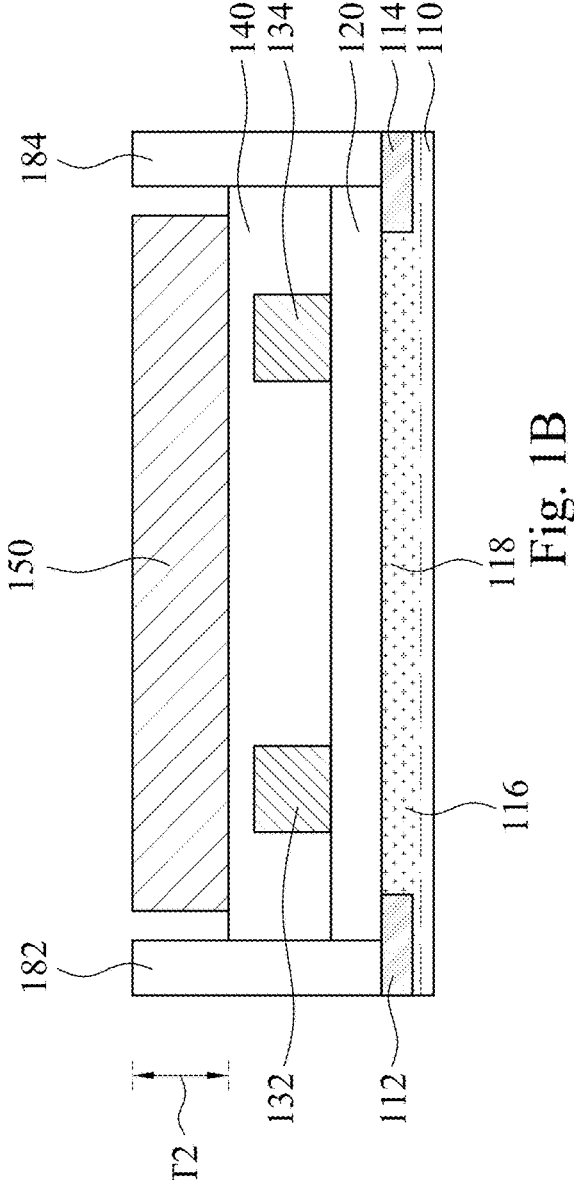
Figure 1C:
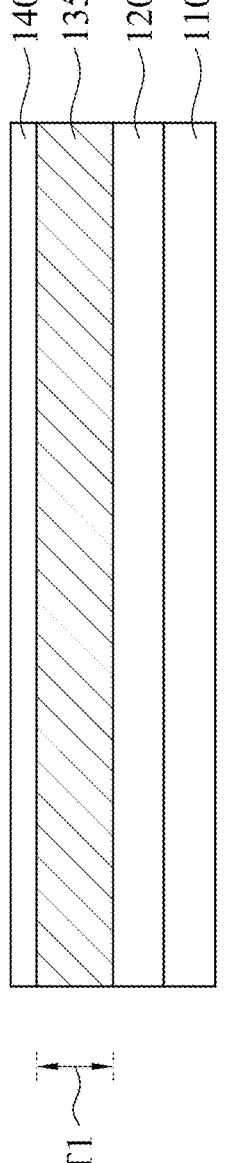
FIG. 1C is a cross-sectional view of the electronic device of FIG. 1A along line C-C.

FIG. 1A is a top view of a device 100 in accordance with some embodiments of the present disclosure, FIG. 1B is a cross-sectional view of the device 100 of FIG. 1A along line B-B, and FIG. 1C is a cross-sectional view of the device 100 of FIG. 1A along line C-C. The device 100 includes a substrate 110, a source region 112, a drain region 114, a channel region 116, a pair of depletion gates 132 and 134, a conductive resonator 135, and an accumulation gate 150. The source region 112 and the drain region 114 are in the substrate 110. The channel region 116 is in the substrate 110 and between the source region 112 and the drain region 114. The depletion gates 132 and 134 are over the channel region 116 and define a quantum dot qubit region 118 in the channel region 116 and between the depletion gates 132 and 134. In some embodiments, the quantum dot qubit region 118 is interchangeably referred to as a quantum dot qubit region that allows only a single carrier (electron or hole) passing from an entrance of the quantum dot qubit region 118 (i.e., a region beneath the depletion gate 132) to an exit of the quantum dot qubit region 118 (i.e., a region beneath the depletion gate 134) before another carrier moves into the quantum dot qubit region 118. The conductive resonator 135 is laterally adjacent the quantum dot qubit region 118. The accumulation gate 150 is over the depletion gates 132 and 134 and covers the channel region 116. At least the conductive resonator 135 is a superconductive material, e.g., MoGe, NbN, TiN, $Nb_3Sn$, TiAl, TaN, TiC, TaSi, Al, or the like, such that the local thermal heating problem near the quantum dot qubit region 118 can be improved. The superconductive resonator 135 also widens the range of the Rabi frequency of the device 100, which will be described in detail below.

The device 100 generates qubits in the quantum dot qubit region 118 one at a time. During operation, an external magnetic field B0 is applied to the quantum dot qubit region 118. A voltage is applied to the accumulation gate 150, which turns on the channel region 116. A current then flows from the source region 112, through the channel region 116, to the drain region 114. The depletion gates 132 and 134 are used to define the location of the quantum dot qubit region 118 and control the tunnel coupling between the source region 112 and the drain region 114. The controlled tunnel coupling allows only a single electron (or hole) passing through the quantum dot qubit region 118 before any other electron (or hole) moves into the quantum dot qubit region 118. The single electron passing through the quantum dot qubit region 118 is called a qubit. The conductive resonator 135 is configured to generate microwave source.

As mentioned above, the conductive resonator 135 is a superconductive material. That is, the conductive resonator 135 has a critical temperature (i.e., superconducting transition temperature) below which the electrical resistance (or effective surface resistance) drops abruptly to about zero. Since the device 100 operates under a temperature lower than the critical temperature of the conductive resonator 135, the conductive resonator 135 is superconductive during the operation. With the low electrical resistance, the local heating issue around the conductive resonator 135 (and near the quantum dot qubit region 118) can be improved, and the Johnson-Nyquist thermal noise in the quantum dot qubit region 118 is reduced. Hence, the coherence time of the qubit is increased, thereby increasing the qubit fidelity. Moreover, the Rabi frequency of the qubit is proportional to the power of the microwave source applied to the conductive resonator 135. Since the conductive resonator 135 is superconductive, which can bear high power of the microwave source due to the improved local heating issue, microwave sources with a wide range of the frequencies can be applied to the device 100, and the application of the device 100 is enhanced.

In some embodiments, the conductive resonator 135 is a type II superconductor, which is a superconductor that exhibits an intermediate phase of mixed ordinary and superconducting properties at intermediate temperature and fields above the superconducting phases. It also features the formation of magnetic field vortices with an applied external magnetic field. This occurs above a certain critical magnetic field strength Hc1. The vortex density increases with increasing field strength. At a higher critical magnetic field Hc2, superconductivity is destroyed. The conductive resonator 135 may be made of MoGe, NbN, TiN, $Nb_3Sn$, or other suitable type II superconductors.

In some embodiments, the type II superconductors used in the conductive resonator 135 are single crystalline materials, which provide good quality of superconductivity property.

For example, a single crystalline type II superconductor has a high critical temperature and a high critical magnetic field. Therefore, the electronic device 100 can be operated under a high temperature and a high external magnetic field without destroying the superconductivity of the conductive resonator 135. For example, the critical magnetic field of the type II superconductors (i.e., the conductive resonator 135 in this case) is higher than the external magnetic field B0 such that the conductive resonator 135 is superconductive during operation. In some embodiments, the critical magnetic field of the type II superconductors is greater than about 0.1 tesla, e.g., in a range from about 0.1 tesla to about 100 tesla.

In some embodiments, the conductive resonator 135 has a width W1 in a range from about 80 nm to about 200 nm. If the width W1 of the conductive resonator 135 is less than about 80 nm, the superconductivity of the conductive resonator 135 may be lost and thus the local heating issue may exist which in turn reduces readout fidelity of the qubits; if the width W1 of the conductive resonator 135 is greater than about 200 nm, the size of the device 100 may be large. In some embodiments, (a linear portion 136 of) the conductive resonator 135 has a length L1 in a range from about 500 nm to about 800 nm. If the length L1 of the conductive resonator 135 is less than about 500 nm, the magnetic field B1 generated from the conductive resonator 135 may not be uniform near the quantum dot qubit region 118; if the length L1 of the conductive resonator 135 is greater than about 800 nm, the local heating issue may not be improved effectively. In some embodiments, the conductive resonator 135 has a thickness T1 in a range from about 40 nm to about 100 nm. If the thickness T1 of the conductive resonator 135 is less than about 40 nm, external magnetic field may penetrate through the conductive resonator 135 and destroy the superconductivity of the conductive resonator 135 during operation; if the thickness T1 of the conductive resonator 135 is greater than about 100 nm, the surface current of the conductive resonator 135 is barely increased with the increase of the thickness T1.

In some embodiments, the conductive resonator 135 includes a linear portion 136, a first angled portion 137, and a second angled portion 138. The first angled portion 137 and the second angled portion 138 are on opposite sides of the linear portion 136 and both extend away from the quantum dot qubit region 118 along a direction angled with respect to the linear portion 136 of the conductive resonator 135. The linear portion 136 is closest to the quantum dot qubit region 118 than the first angled portion 137 and the second angled portion 138. The first angled portion 137 and the second angled portion 138 can be landing pads for contacts that are connected to the external power source. A distance D3 between the first angled portion 137 and the second angled portion 138 of the conductive resonator 135 is greater than a distance D4 between the depletion gates 132 and 134.

The depletion gates 132 and 134 are spaced apart from each other and between the source region 112 and the drain region 114 in a top view. That is, the depletion gates 132 and 134 both overlap the channel region 116. The depletion gate 132 is between the source region 112 and the depletion gate 134, and the depletion gate 134 is between the depletion gate 132 and the drain region 114. The depletion gates 132 and 134 do not overlap the source region 112 and the drain region 114 in the top view. The depletion gates 132 and 134 extend along a direction non-parallel with the linear portion 136 of the conductive resonator 135 in the top view. The depletion gates 132 and 134 define the quantum dot qubit region 118 therebetween and in the channel region 116. In some embodiments, an area of the quantum dot qubit region 118 is about 2250 nm2 to about 2500 nm2 in the top view. Stated another way, the depletion gate 132 is separated from the depletion gate 134 by a distance D1 in a range from about 45 nm to about 50 nm. None or more than one qubit may be occupied in the quantum dot qubit region 118 if the distance D1 is out of this range.

The accumulation gate 150 is above the conductive resonator 135 and the depletion gates 132 and 134. Further, the accumulation gate 150 covers the entirety of the quantum dot qubit region 118. In some embodiments, the accumulation gate 150 extends from above the source region 112 to above the drain region 114. Therefore, the accumulation gate 150 also covers portions of the depletion gates 132 and 134 directly above the channel region 116. In some embodiments, the length L1 of the linear portion 136 of the conductive resonator 135 is greater than a length L2 of the accumulation gate 150. In some embodiments, the accumulation gate 150 has a thickness T2 greater than the thickness T1 of the conductive resonator 135. A high voltage is applied to the accumulation gate 150 during the operation to turn on the channel region 116 by inducing an inversion layer on the top surface of the channel region 116, so the accumulation gate 150 is designed to be thick enough to bear the high voltage. In some embodiments, the thickness T2 of the accumulation gate 150 is in a range from about 30 nm to about 100 nm.

In some embodiments, a lateral distance D2 between the conductive resonator 135 and the accumulation gate 150 is in a range from about 15 nm to about 50 nm, such that the conductive resonator 135 has a good control for the spin of qubits with low microwave source power, and the device 100 is easy to be fabricated and has a dense package density. Further, with such range, the conductive resonator 135 and the gates (i.e., the accumulation gate 150 and the depletion gates 132 and 134) still have good electrically isolation therebetween. If the lateral distance D2 is less than about 15 nm, current leakage may occurs between the conductive resonator 135 and the gates, thereby increasing noise and lowering controllability; if the lateral distance D2 is greater than about 50 nm, the microwave source power may be increased, which may surpass the critical current of the conductive resonator 135 and break superconductivity thereof.

In some embodiments, the accumulation gate 150 and/or the depletion gates 132 and 134 are superconductive materials as the conductive resonator 135. That is, the accumulation gate 150 and/or the depletion gates 132 and 134 can be type II superconductors and may be single crystalline. As such, the superconductive accumulation gate 150 and/or the superconductive depletion gates 132 and 134 also improve the local heating issues near the quantum dot qubit region 118. In some embodiments, the accumulation gate 150, the depletion gates 132 and 134, and the conductive resonator 135 are made of the same superconductive materials, such that the accumulation gate 150, the depletion gates 132 and 134, and the conductive resonator 135 have the same critical temperature (i.e., superconducting transition temperature) and the same critical magnetic field. In some embodiments, the accumulation gate 150, the depletion gates 132 and 134, and the conductive resonator 135 are made of different superconductive materials. For example, the conductive resonator 135 has a critical temperature (and/or a critical magnetic field) higher than that of the accumulation gate 150 (and/or the depletion gates 132 and 134).

In some embodiments, the substrate 110 and the channel region 116 are both of a first conductivity type, and the source region 112 and the drain region 114 are both of a second conductivity type opposite to the first conductivity type. For example, the substrate 110 is a p-type silicon substrate (p-substrate). P-type dopants may be introduced into the substrate 110 to form the p-substrate. The channel region 116 is a p-type region and has a dopant concentration greater than a dopant concentration of the substrate 110. The source region 112 and the drain region 114 are both n-type regions. In some other embodiments, both the substrate 110 and the channel region 116 are n-type, and both the source region 112 and the drain region 114 are p-type.

In some embodiments, the device 100 further includes a source contact 182 and a drain contact 184. The source contact 182 is connected to the source region 112 and forms an ohmic contact at the interface between the source contact 182 and the source region 112. Similarly, the drain contact 184 is connected to the drain region 114 and forms an ohmic contact at the interface between the drain contact 184 and the drain region 114. In some embodiments, the source contact 182 and the drain contact 184 are superconductive materials as well. Since the details of the superconductive materials are described above, and, therefore, a description in this regard will not be repeated hereinafter.

In some embodiments, the device 100 further includes a first dielectric layer 120 and a second dielectric layer 140. The first dielectric layer 120 is between the substrate 110 and the depletion gates 132 and 134. As such, the first dielectric layer 120 provides good electrically isolation between the depletion gates 132 and 134 and the channel region 116. The second dielectric layer 140 covers the depletion gates 132 and 134 and the conductive resonator 135, and the accumulation gate 150 is above the second dielectric layer 140. That is, the second dielectric layer 140 is between the accumulation gate 150 and the depletion gates 132 and 134 to provide electrical isolation between the accumulation gate 150 and other conductive elements (i.e., the conductive resonator 135 and the depletion gates 132 and 134).

FIGS. 2A-8C illustrate top views and cross-sectional views of intermediate stages in the formation of a device 100a in accordance with some embodiments of the present disclosure. Throughout the various views and illustrative embodiments, like reference numbers are used to designate like elements. It is understood that additional operations can be provided before, during, and after the processes shown by FIGS. 2A-8C, and some of the operations described below can be replaced or eliminated, for additional embodiments of the method. The order of the operations/processes may be interchangeable.

FIGS. 2A, 3A, 4A, 5A, 6A, 7A, and 8A are top views of some embodiments of the device 100a at intermediate stages in accordance with some embodiments of the present disclosure. FIGS. 2B, 3B, 4B, 5B, 6B, 7B, and 8B are cross-sectional views of some embodiments of the device 100a at intermediate stages along line B-B. FIGS. 2C, 3C, 4C, 5C, 6C, 7C, and 8C are cross-sectional views of some embodiments of the device 100a at intermediate stages along line C-C.

Reference is made to FIGS. 2A, 2B, and 2C. A substrate 110 is provided. In some embodiments, the substrate 110 includes silicon (Si). Alternatively, the substrate 110 may include germanium (Ge), silicon germanium, gallium arsenide (GaAs), or other appropriate semiconductor materials. In some alternative embodiments, the substrate 110 includes an epitaxial layer with or without dopants. Furthermore, the substrate 110 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen technology, wafer bonding, selective epitaxial growth (SEG), or other appropriate method. In the some embodiments, the substrate 110 includes a p-type silicon substrate (p-substrate). For example, p-type dopants are introduced into the substrate 110 to form the p-substrate.

An implantation process is performed to introduce first impurities into the substrate 110 to form a well region 116 in the substrate 110. The first impurities may be p-type impurities or n-type impurities. The n-type impurities may be phosphorus, arsenic, or the like, and the p-type impurities may be boron, $BF_2$, or the like. For example, the well region 116 is a p-type region formed in the p-substrate. At least a portion of the well region 116 will serve as channel region for the device 100 as discussed previously.

Another implantation process is then performed to introduce second impurities into the well region 116 to form a source region 112 and a drain region 114 in the well region 116. The second impurities may be n-type impurities or p-type impurities. The n-type impurities may be phosphorus, arsenic, or the like, and the p-type impurities may be boron, $BF_2$, or the like. For example, the source region 112 and the drain region 114 are n-type regions formed in the p-type well region 116, such that a portion of the well region 116 between the source region 112 and the drain region 114 is referred to as a channel region.

Figure 3A:
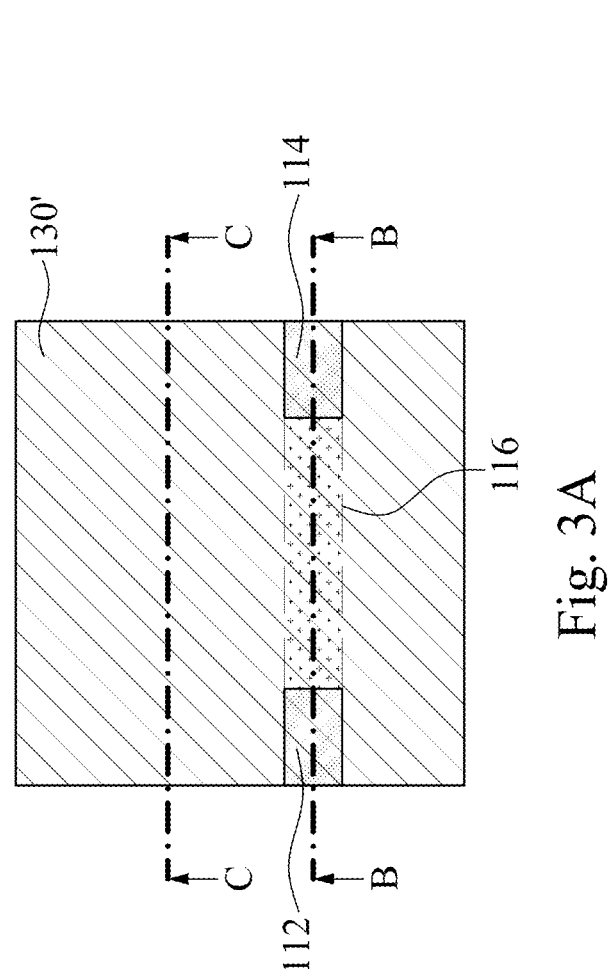
Figure 3C:
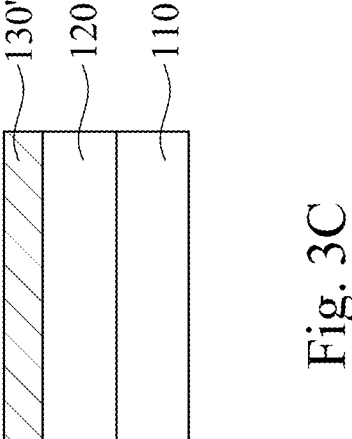
Figure 3B:
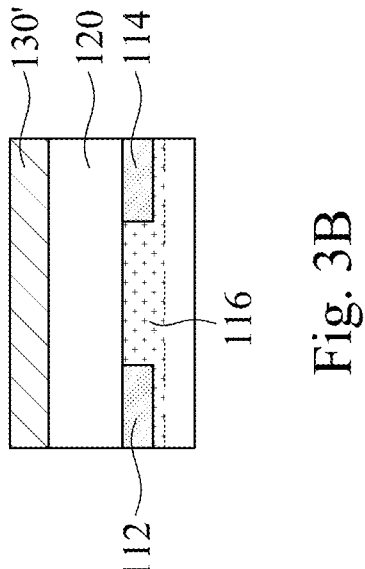

Reference is made to FIGS. 3A, 3B, and 3C. A first gate dielectric layer 120 and a first conductive layer 130' are sequentially formed over the structure in FIG. 1A. In some embodiments, the first gate dielectric layer 120 includes silicon dioxide, silicon nitride, or other suitable material. Alternatively, the first gate dielectric layer 120 can be a high-κ dielectric layer having a dielectric constant (κ) higher than the dielectric constant of $SiO_2$, i.e. κ>3.9. The first gate dielectric layer 120 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The first gate dielectric layer 120 is deposited by suitable techniques, such as ALD, CVD, PVD, thermal oxidation, combinations thereof, or other suitable techniques.

The first conductive layer 130' is formed over the first gate dielectric layer 120. The first conductive layer 130' includes one or more layers of conductive material. Examples of the first conductive layer 130' include is a type II superconductor including MoGe, NbN, TiN, $Nb_3Sn$, or other suitable type II superconductors. The first conductive layer 130' may be formed by physical vapor deposition (PVD) including sputtering, chemical vapor deposition (CVD), atomic layer deposition (ALD) or other suitable method.

Figures 4A, 4B, 4C:
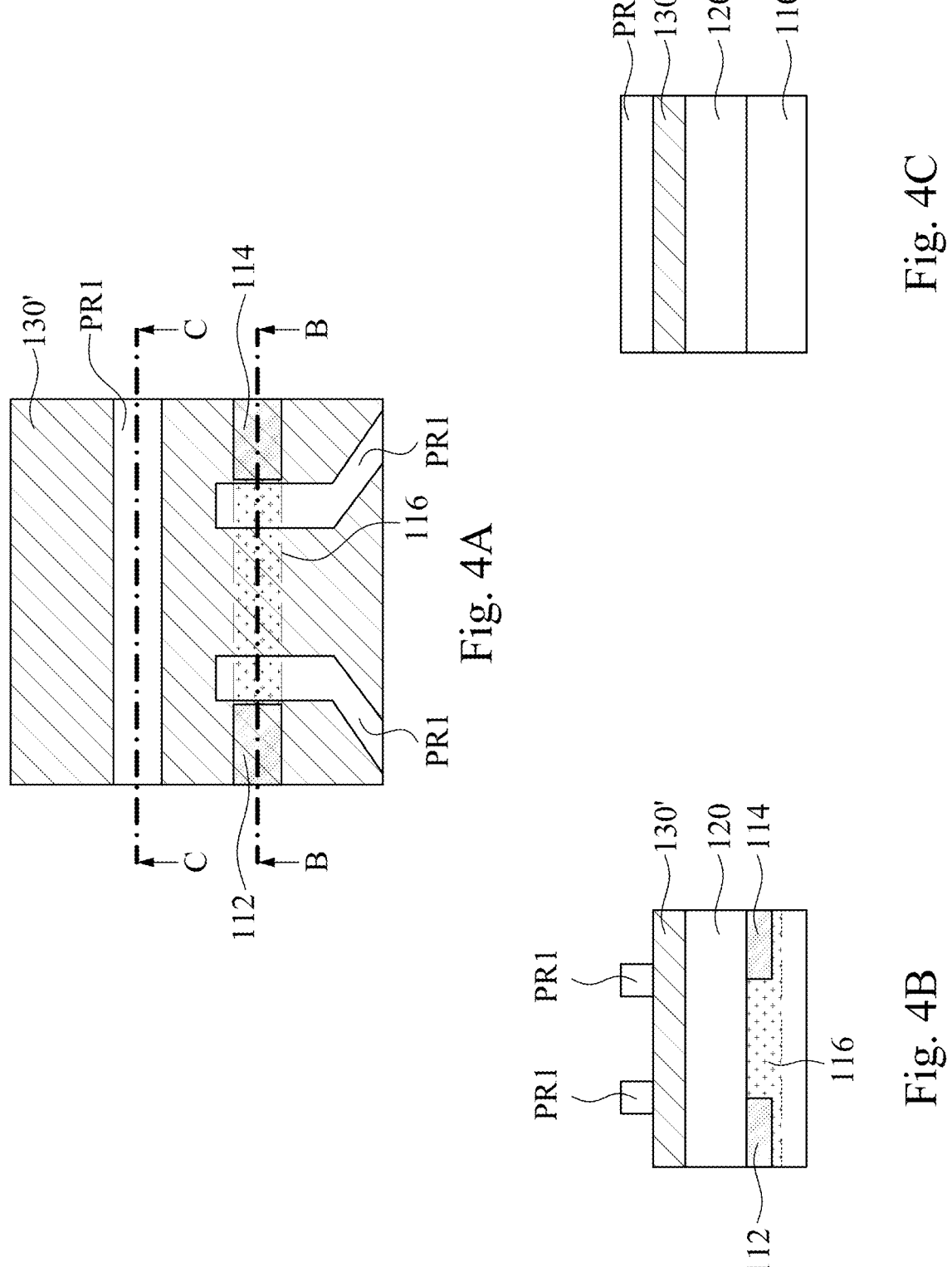

Reference is made to FIGS. 4A, 4B, and 4C. A patterned photoresist layer PR1 is formed over the substrate 110 to cover portions of the first conductive layer 130' and expose other portions of the first conductive layer 130'.

Figures 5A, 5B, 5C:
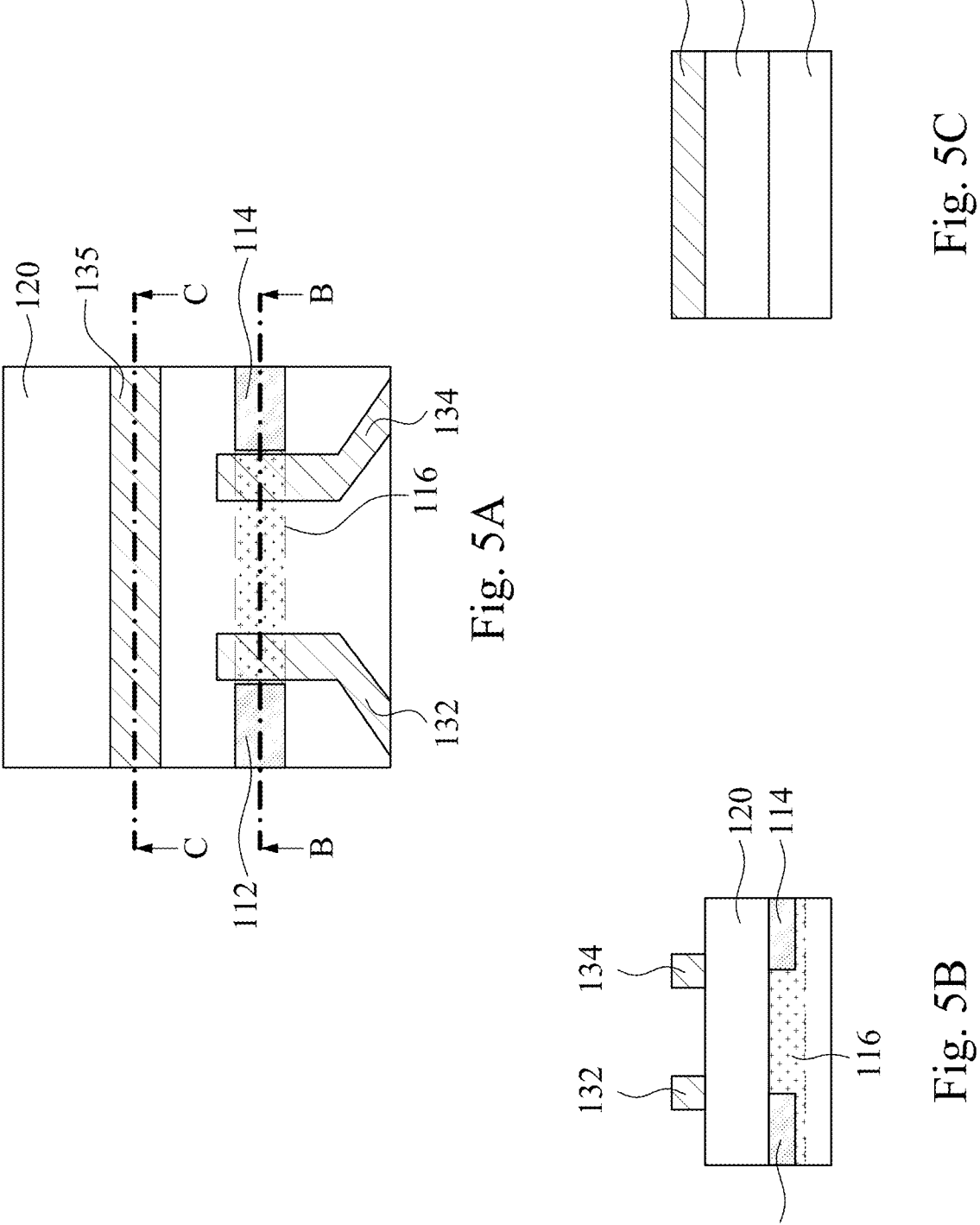

Reference is made to FIGS. 5A, 5B, and 5C. The first conductive layer 130' in FIGS. 4A, 4B, and 4C is patterned, by using the patterned photoresist layer PR1 (see FIGS. 4A, 4B, and 4C) as an etch mask, to form a pair of depletion gates 132, 134 and a conductive resonator 135. The patterning of the first conductive layer 130' may be performed by using an etching process. In some embodiments, the etching process is a dry etching process with etching gases $CF_4$, $SF_6$, combinations thereof, or the like. After the etching process, the patterned photoresist layer PR1 is removed, and the removal method may be performed by solvent stripping or plasma ashing, for example. The pair of the depletion gates 132 and 134 are formed between the source region 112 and the drain region 114. For example, the depletion gate 132 partially covers the source region 112, and the depletion gate 134 partially covers the drain region 114. The pair of the depletion gates 132 and 134 are spaced apart from each other. The conductive resonator 135 is spaced apart from the depletion gates 132 and 134 and extends in a direction different from (e.g., substantially perpendicular to) an extension direction of the depletion gates 132 and 134.

Figures 6A, 6B, 6C:
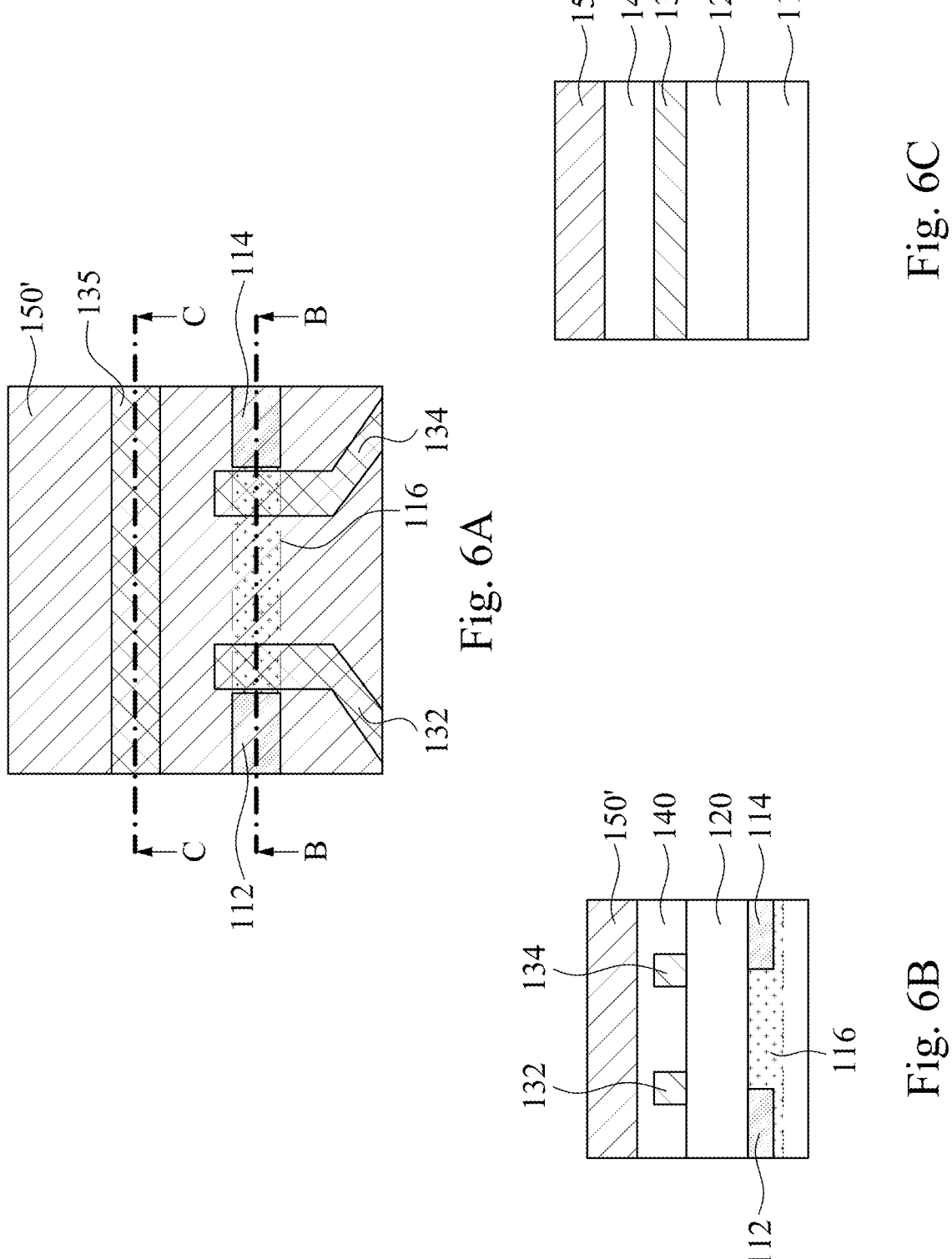

Reference is made to FIGS. 6A, 6B, and 6C. A second gate dielectric layer 140 and a second conductive layer 150' are sequentially formed over the first gate dielectric layer 120, the depletion gates 132, 134, and the conductive resonator 135. The second gate dielectric layer 140 covers the first gate dielectric layer 130, the depletion gates 132, 134, and the conductive resonator 135. In some embodiments, the second gate dielectric layer 140 can be a high-κ dielectric layer having a dielectric constant (κ) higher than the dielectric constant of $SiO_2$, i.e. κ>3.9. The second gate dielectric layer 140 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. Alternatively, the second gate dielectric layer 140 may include silicon dioxide, silicon nitride, or other suitable material. The second gate dielectric layer 140 is deposited by suitable techniques, such as ALD, CVD, PVD, thermal oxidation, combinations thereof, or other suitable techniques.

The second conductive layer 150' is formed over the first gate dielectric layer 120. The second conductive layer 150' includes one or more layers of conductive material. Examples of the second conductive layer 150' include is a type II superconductor including MoGe, NbN, TiN, $Nb_3Sn$, or other suitable type II superconductors. The second conductive layer 150' may be formed by physical vapor deposition (PVD) including sputtering, chemical vapor deposition (CVD), atomic layer deposition (ALD) or other suitable method.

Figures 7A, 7B, 7C:
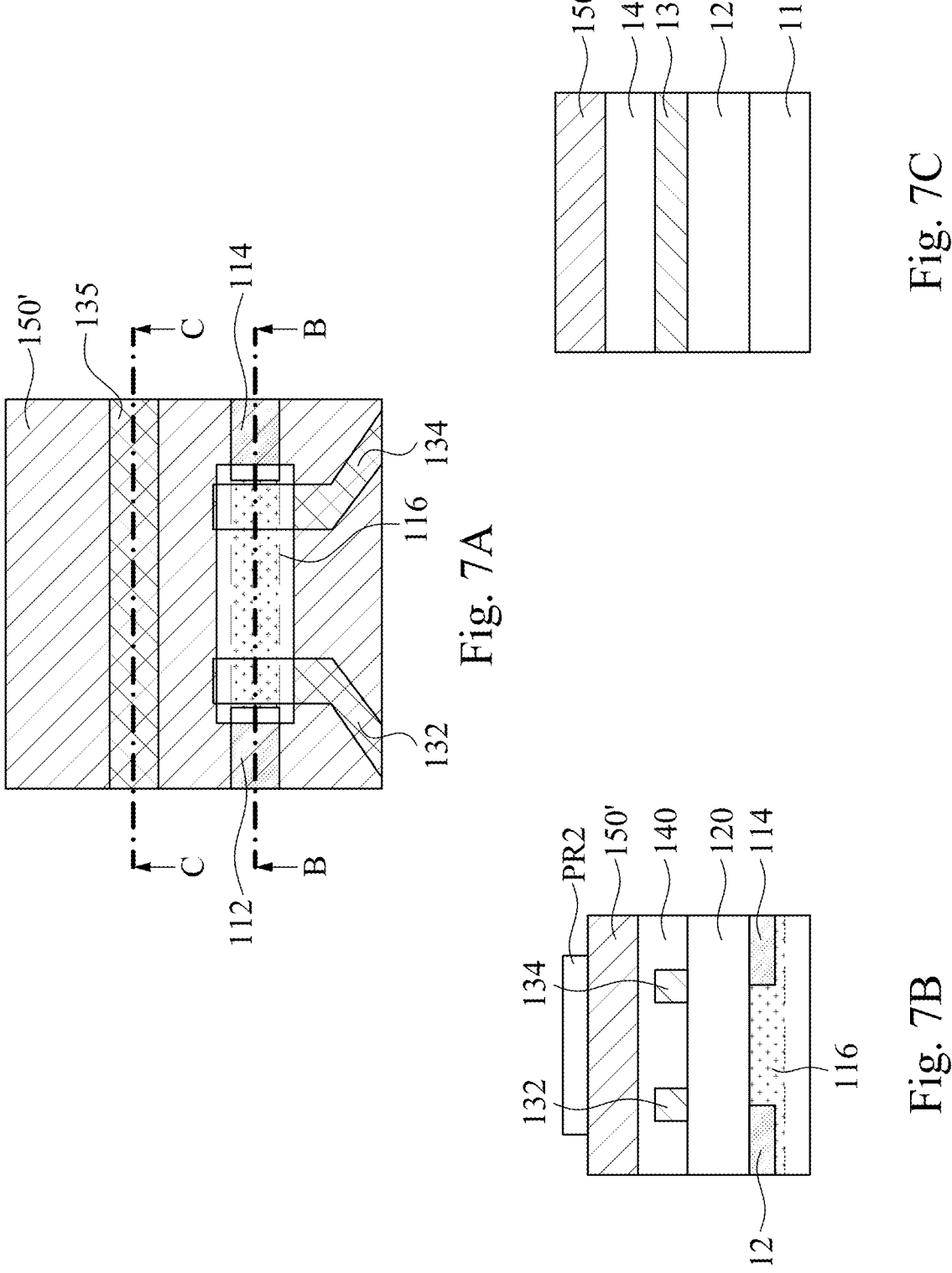

Reference is made to FIGS. 7A, 7B, and 7C. A patterned photoresist layer PR2 is formed over the substrate 110 to cover portions of the second conductive layer 150' and expose other portions of the second conductive layer 150'.

Figures 8A, 8B, 8C:
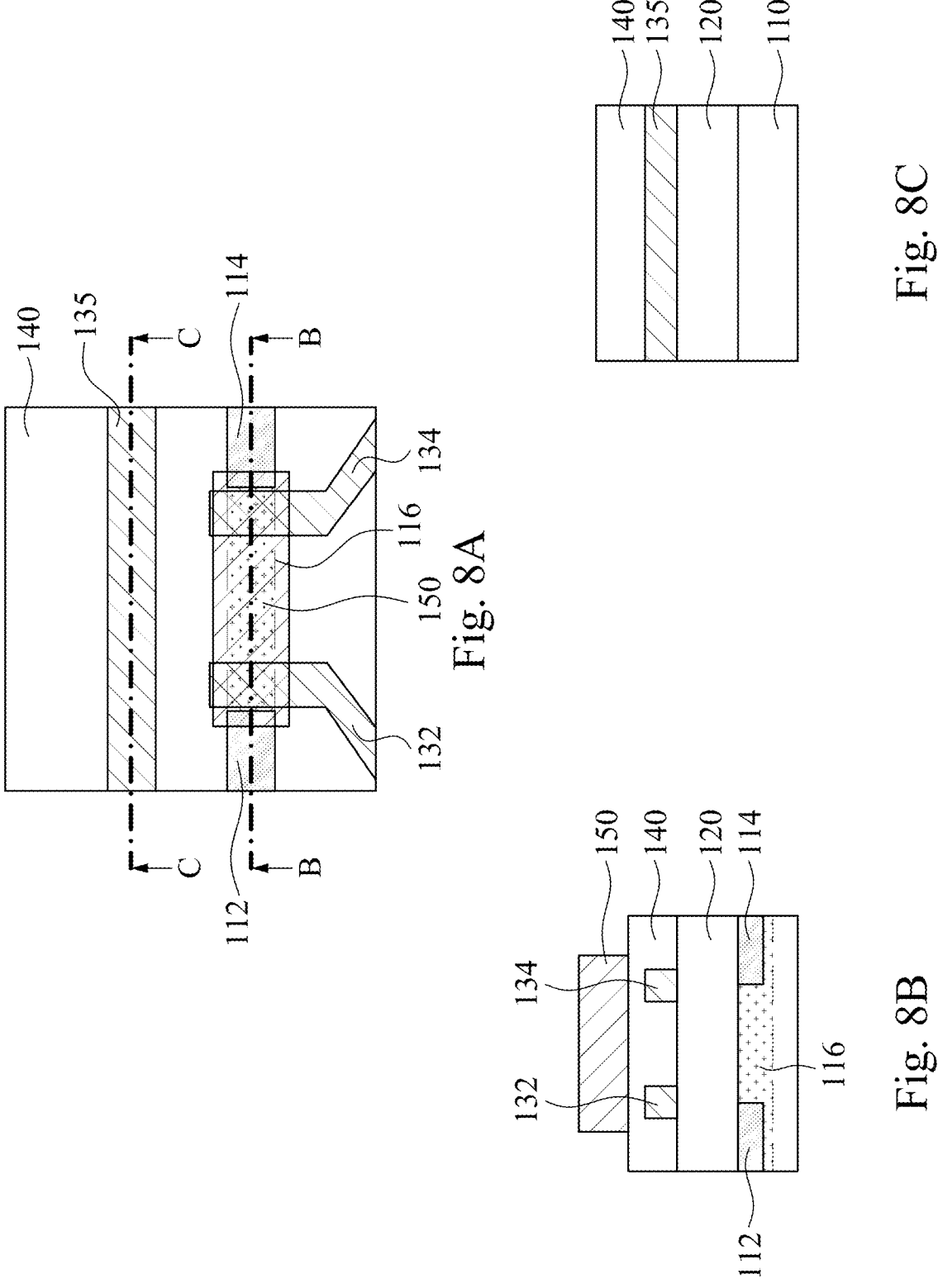

Reference is made to FIGS. 8A, 8B, and 8C. The second conductive layer 150' in FIGS. 7A, 7B, and 7C is patterned, by using the patterned photoresist layer PR2 (see FIGS. 7A, 7B, and 7C) as an etch mask, to form an accumulation gate 150. The patterning of the second conductive layer 150' may be formed by using an etching process. In some embodiments, the etching process is a dry etching process with etching gases $CF_4$, $SF_6$, combinations thereof, or the like. After the etching process, the patterned photoresist layer PR2 is removed, and the removal method may be performed by solvent stripping or plasma ashing, for example. The accumulation gate 150 partially covers the depletion gates 132, 134, the channel region 116, the source region 112, and the drain region 114. Further, the accumulation gate 150 is spaced apart from the conductive resonator 135 in the top view as shown in FIG. 8A.

In FIGS. 8A-8C, all of the conductive resonator 135, the depletion gates 132, 134, and the accumulation gate 150 are superconductive materials. That is, all of the critical magnetic fields of the conductive resonator 135, the depletion gates 132, 134, and the accumulation gate 150 are higher than the external magnetic field B0 (see FIG. 1A).

Figures 9A, 9B, 9C:
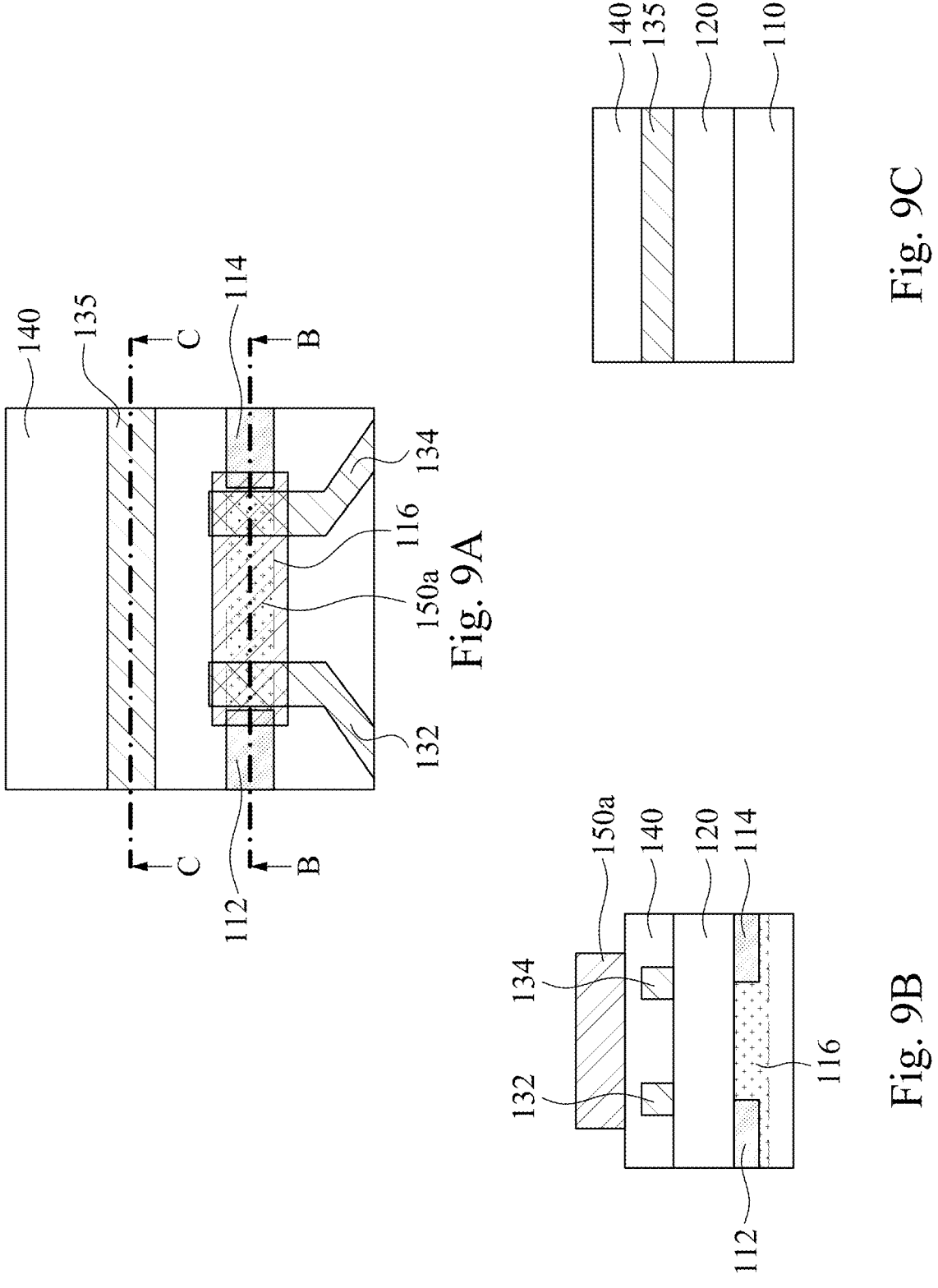
FIG. 9A is a top view of an electronic device in accordance with some embodiments of the present disclosure.
FIG. 9B is a cross-sectional view of the electronic device along line B-B.
FIG. 9C is a cross-sectional view of the electronic device along line C-C.

In some embodiments, the accumulation gate is made of a conductive material, instead of a superconductive material. FIG. 9A is a top view of a device 100*b* in accordance with some embodiments of the present disclosure, FIG. 9B is a cross-sectional view of the device 100*b* along line B-B, and FIG. 9C is a cross-sectional view of the device 100*b* along line C-C. The difference between the devices 100*b* and 100*a* (see FIGS. 8A-8C) pertains to the material of the accumulation gate. In FIGS. 9A-9C, the device 100*b* includes an accumulation gate 150*a* made of a conductive material, instead of a superconductive material. During operation, the conductive resonator 135 and the depletion gates 132, 134 are both in superconductive state while the accumulation gate 150*a* is in a normal state. That is, the accumulation gate 150*a* has an electrical resistance (or effective surface resistance) greater than that of the conductive resonator 135 and the depletion gates 132, 134 during operation. In FIGS. 9A-9C, the conductive resonator 135 and the depletion gates 132, 134 are superconductive materials, and the accumulation gate 150*a* is a (normal) conductive material (i.e., non-superconductive material), e.g., W, Ti, TiAlC, TaAlC, Co, TaC, HfTi, combinations thereof, or the like. That is, the critical magnetic fields of the conductive resonator 135 and the depletion gates 132, 134 are higher than the external magnetic field B0 (see FIG. 1A). Further, critical temperatures of the conductive resonator 135 and the depletion gates 132, 134 are higher than a critical temperature of the accumulation gate 150*a*. Other features of the device 100*b* are similar to or the same as those of the device 100*a* shown in FIGS. 8A-8C, and therefore, a description in this regard will not be provided hereinafter.

FIGS. 10A-14C illustrate top views and cross-sectional views of intermediate stages in the formation of a device 100*c* in accordance with some embodiments of the present disclosure. Throughout the various views and illustrative embodiments, like reference numbers are used to designate like elements. It is understood that additional operations can be provided before, during, and after the processes shown by FIGS. 10A-14C, and some of the operations described below can be replaced or eliminated, for additional embodiments of the method. The order of the operations/processes may be interchangeable.

FIGS. 10A, 11A, 12A, 13A, and 14A are top views of some embodiments of the device 100*c* at intermediate stages in accordance with some embodiments of the present disclosure. FIGS. 10B, 11B, 12B, 13B, and 14B are cross-sectional views of some embodiments of the device 100*c* at intermediate stages along line B-B. FIGS. 10C, 11C, 12C, 13C, and 14C are cross-sectional views of some embodiments of the device 100*c* at intermediate stages along line C-C.

Figure 10A:
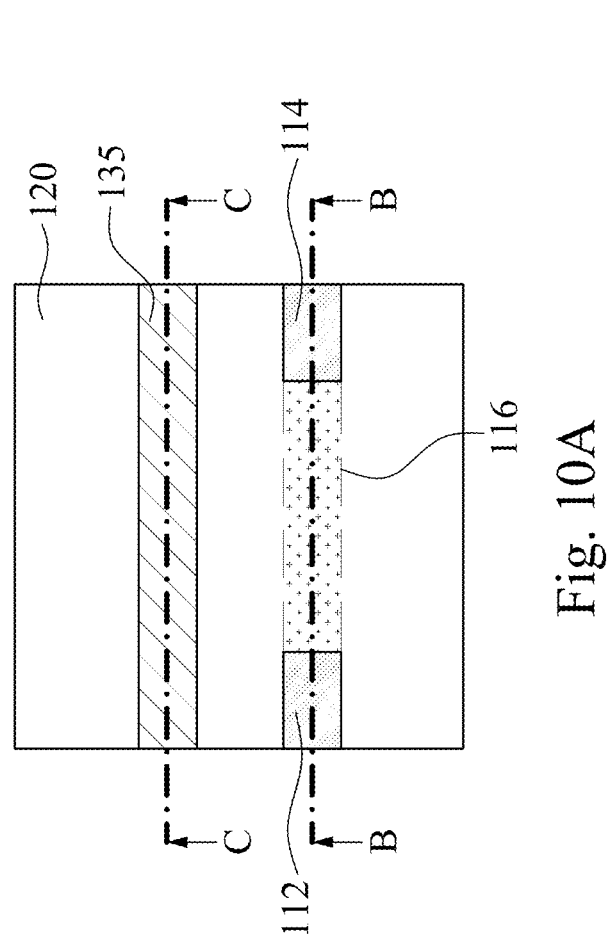
Figure 10C:
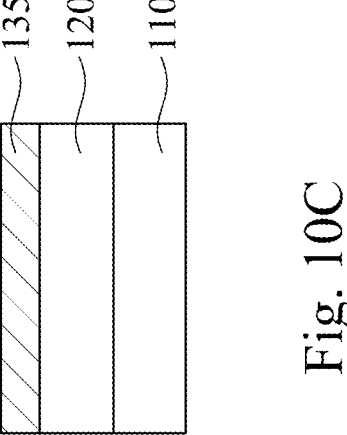
Figure 10B:
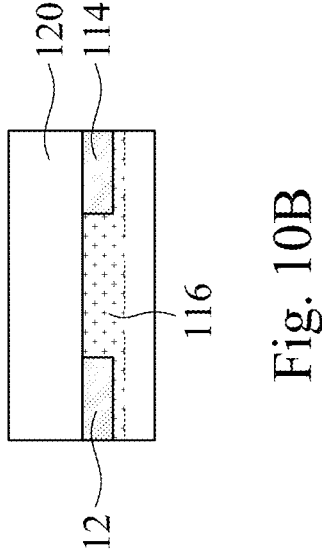

Reference is made to FIGS. 10A, 10B, and 10C. The manufacturing processes of FIGS. 2A-3C are performed first. Since the relevant manufacturing details are all the same as or similar to the embodiments shown in FIGS. 2A-3C, and, therefore, a description in this regard will not be repeated hereinafter. Subsequently, the first conductive layer 130' in FIGS. 3A-3C is patterned into the conductive resonator 135, as shown in FIGS. 10A-10C. Materials, configurations, dimensions, processes and/or operations regarding the conductive resonator 135 are similar to or the same as the conductive resonator 135 of FIG. 5A.

Figure 11C:
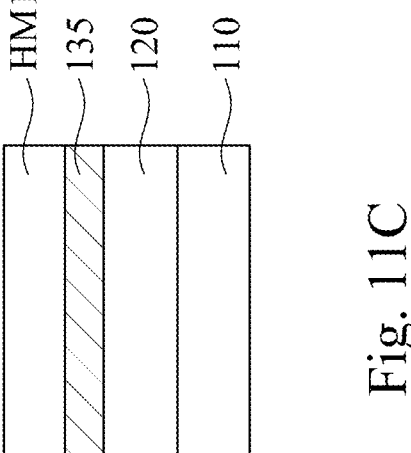
Figure 11A:
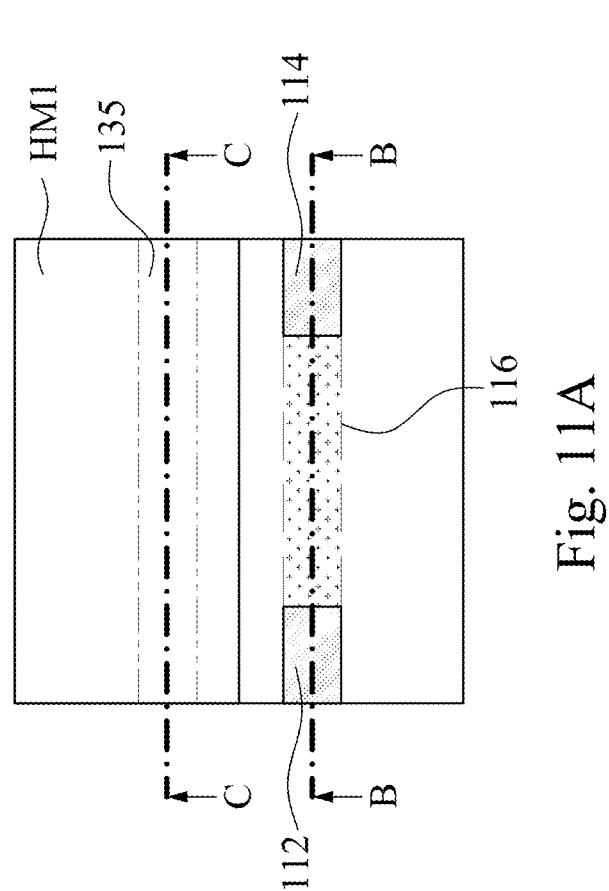
Figure 11B:
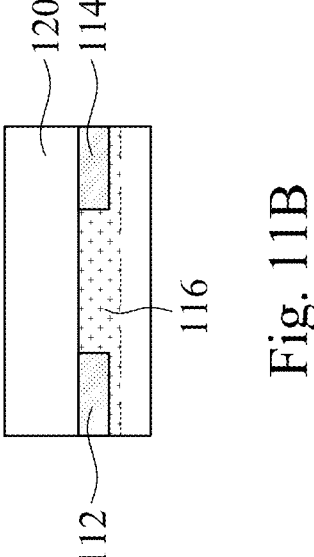

Reference is made to FIGS. 11A, 11B, and 11C. A protection layer HM1 is formed over the substrate 110 and covers the conductive resonator 135. Further, the protection layer HM1 exposes a portion of the first gate dielectric layer 120 directly above the source region 112 and the drain region 114. The protection layer HM1 may be formed of a material that includes an oxide material, such as titanium oxide, silicon oxide, or the like; a nitride material, such as silicon nitride, boron nitride, titanium nitride, tantalum nitride; a carbide material, such as tungsten carbide, silicon carbide; a semiconductor material such as silicon; a metal, such as titanium, tantalum; or combinations thereof. The protection layer HM1 may be formed using a process such as CVD, ALD, or the like.

Figure 12C:
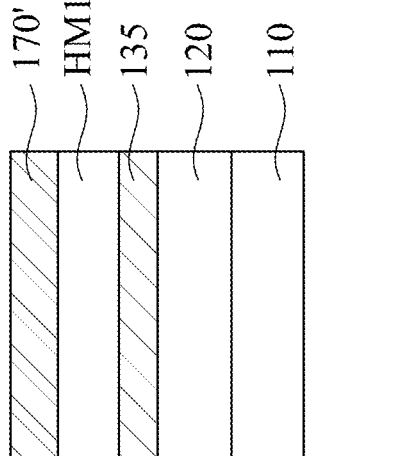
Figure 12A:
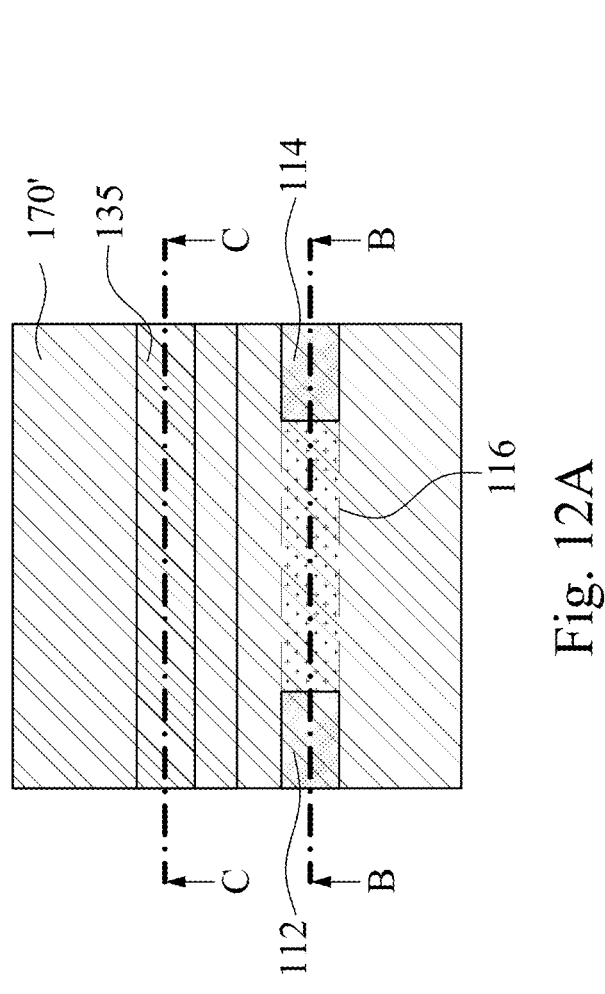
Figure 12B:
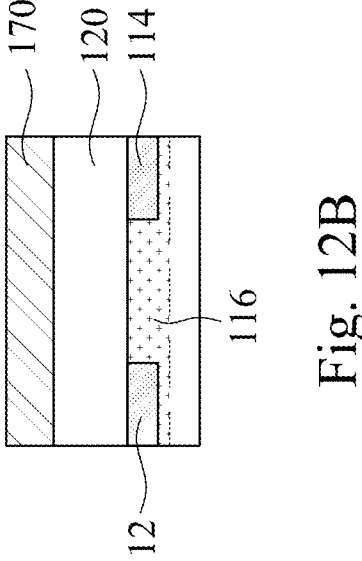

Reference is made to FIGS. 12A, 12B, and 12C. A conductive layer 170' is formed over the first gate dielectric layer 120 and the protection layer HM1. The conductive layer 170' includes one or more layers of (normal) conductive materials (i.e., non-superconductive materials). Examples of the conductive layer 170' include W, Ti, TiAlC, TaAlC, Co, TaC, HfTi, combinations thereof, or the like. The conductive layer 170' may be formed by chemical vapor deposition (CVD), physical vapor deposition (PVD) including sputtering, atomic layer deposition (ALD) or other suitable method.

Figures 13A, 13B, 13C:
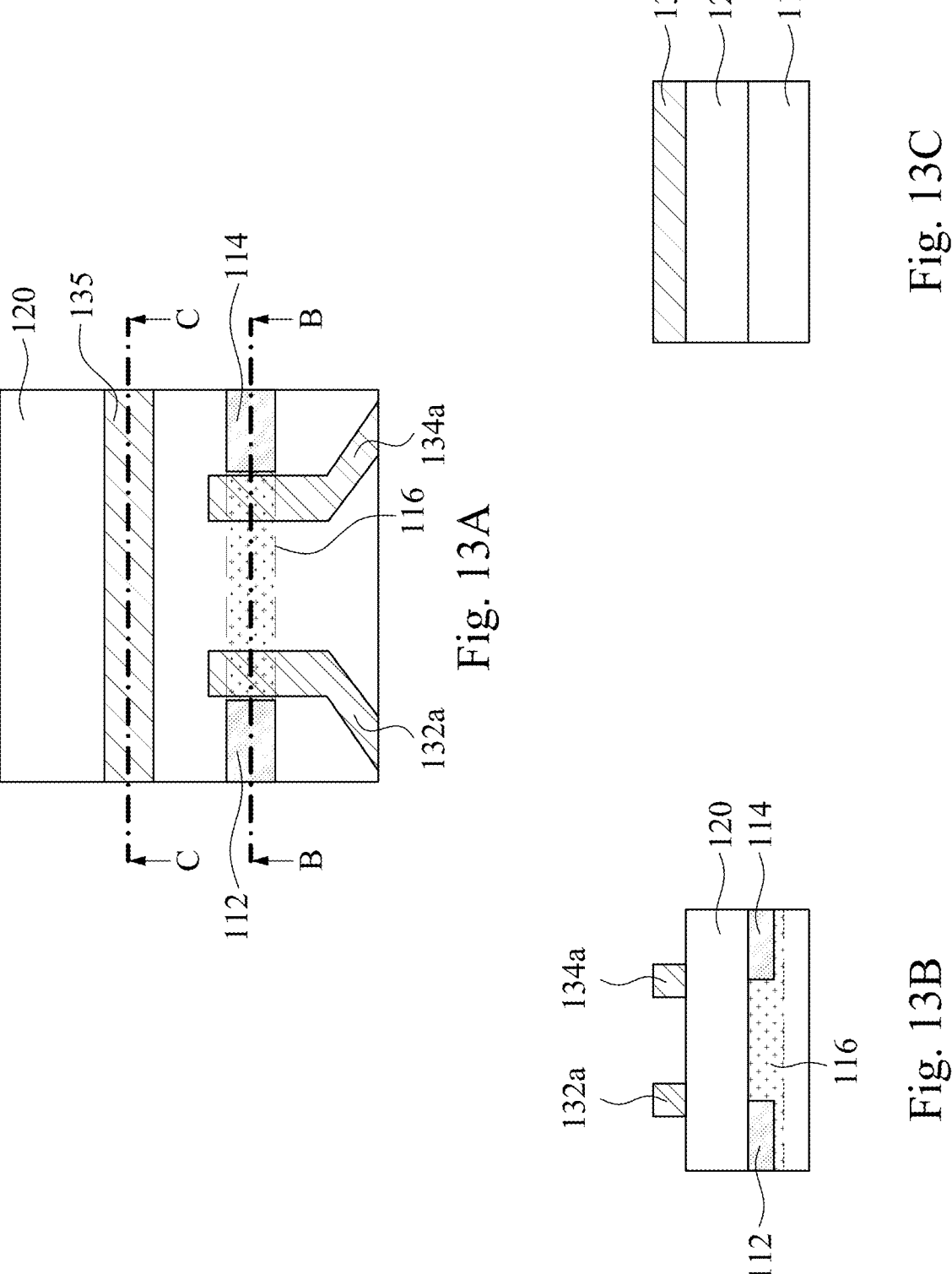

Reference is made to FIGS. 13A, 13B, and 13C. The conductive layer 170' in FIGS. 12A, 12B, and 12C is patterned to form a pair of depletion gates 132*a* and 134*a*. The patterning of the conductive layer 170' may be performed using an etching process. The pair of the depletion gates 132*a* and 134*a* are formed between the source region 112 and the drain region 114. For example, the depletion gate 132*a* partially covers the source region 112, and the depletion gate 134*a* partially covers the drain region 114. The pair of the depletion gates 132*a* and 134*a* are spaced apart from each other. The conductive resonator 135 is spaced apart from the depletion gates 132*a* and 134*a* and extends in a direction different from (e.g., substantially perpendicular to) an extension direction of the depletion gates 132*a* and 134*a*. The depletion gates 132*a*, 134*a* and the conductive resonator 135 are made of different materials. For example, each of the depletion gates 132*a* and 134*a* has an electrical resistance (or effective surface resistance) greater than that of the conductive resonator 135 (during operation). After the formation of the depletion gates 132*a* and 134*a*, the protection layer HM1 (see FIG. 12C) is removed by using, for example, an etching process.

Figures 14A, 14B, 14C:
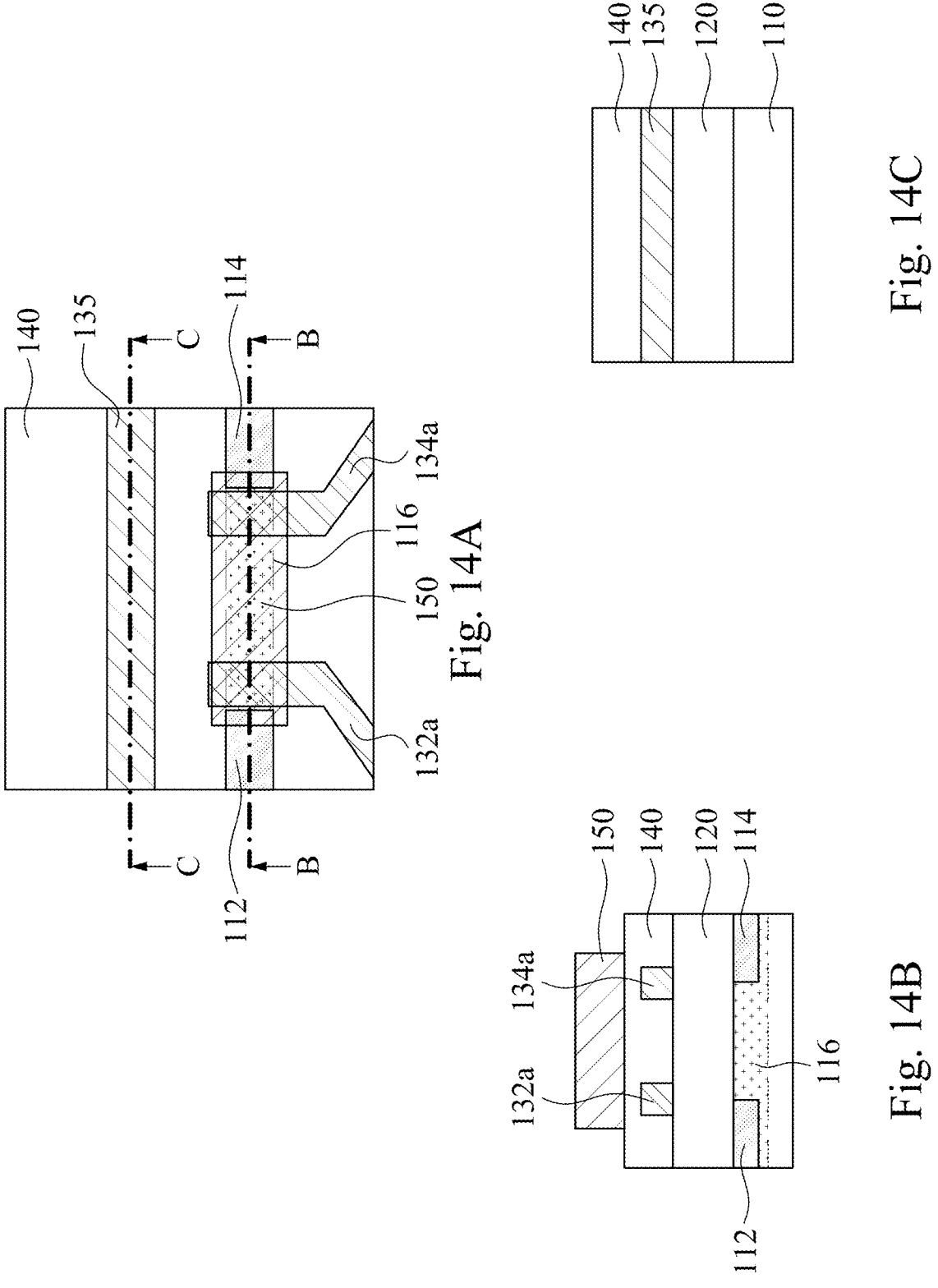

Reference is made to FIGS. 14A, 14B, and 14C. The structure shown in FIGS. 13A-13C undergoes the processes similar to that shown in FIGS. 6A-8C. That is, a second gate dielectric layer 140 and a second conductive layer 150' (see FIGS. 7A-7C) are sequentially formed over the first gate dielectric layer 120, the depletion gates 132*a*, 134*a*, and the conductive resonator 135. A patterned photoresist layer PR2 (see FIGS. 7A-7C) is formed over the substrate 110 to cover portions of the second conductive layer 150' and expose other portions of the second conductive layer 150'. Subsequently, the second conductive layer 150' is patterned, by using the patterned photoresist layer PR2 as an etch mask, to form an accumulation gate 150 as shown in FIGS. 14A and 14B. Materials, configurations, dimensions, processes and/or operations regarding the accumulation gate 150 are similar to or the same as the accumulation gate 150 of FIG. 8A. Materials, configurations, dimensions, processes and/or operations regarding the second gate dielectric layer 140 are similar to or the same as the second gate dielectric layer 140 of FIG. 8A.

In FIGS. 14A-14C, the conductive resonator 135 and the accumulation gate 150 are superconductive materials, and the depletion gates 132*a*, 134*a* are (normal) conductive materials (i.e., non-superconductive materials). That is, the critical magnetic fields of the conductive resonator 135 and the accumulation gate 150 are higher than the external magnetic field B0 (see FIG. 1A). Further, critical temperatures of the conductive resonator 135 and the accumulation gate 150 are higher than critical temperatures of the depletion gates 132a, 134a.

Figures 15A, 15B, 15C:
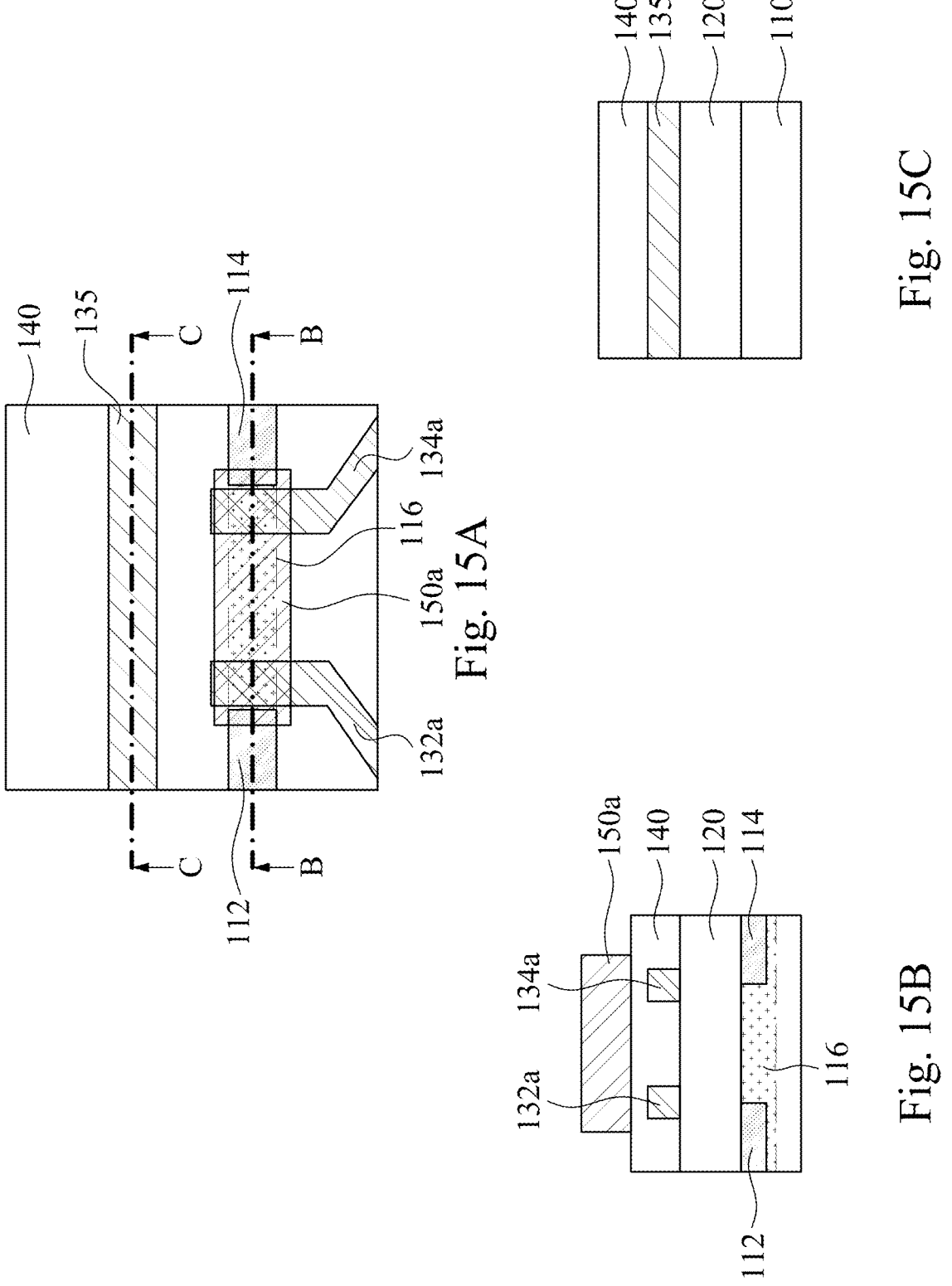
FIG. 15A is a top view of an electronic device in accordance with some embodiments of the present disclosure.
FIG. 15B is a cross-sectional view of the electronic device along line B-B.
FIG. 15C is a cross-sectional view of the electronic device along line C-C.

In some embodiments, the accumulation gate is made of a conductive material, instead of a superconductive material. FIG. 15A is a top view of a device 100d in accordance with some embodiments of the present disclosure, FIG. 15B is a cross-sectional view of the device 100d along line B-B, and FIG. 15C is a cross-sectional view of the device 100d along line C-C. The difference between the devices 100d and 100c (see FIGS. 14A-14C) pertains to the material of the accumulation gate. In FIGS. 15A-15C, the device 100d includes an accumulation gate 150a made of a conductive material, instead of a superconductive material. During operation, the conductive resonator 135 is in superconductive state while the accumulation gate 150a is in a normal state. That is, the accumulation gate 150a has an electrical resistance (or effective surface resistance) greater than that of the conductive resonator 135 during operation. Further, the conductive resonator 135 is a superconductive material, and the depletion gates 132a, 134a are (normal) conductive materials (i.e., non-superconductive materials). That is, the critical magnetic field of the conductive resonator 135 is higher than the external magnetic field B0 (see FIG. 1A). Further, the critical temperature of the conductive resonator 135 is higher than critical temperatures of the depletion gates 132a, 134a and the accumulation gate 150a. Other features of the device 100d are similar to or the same as those of the device 100c shown in FIGS. 14A-14C, and therefore, a description in this regard will not be provided hereinafter.

Figure 16:
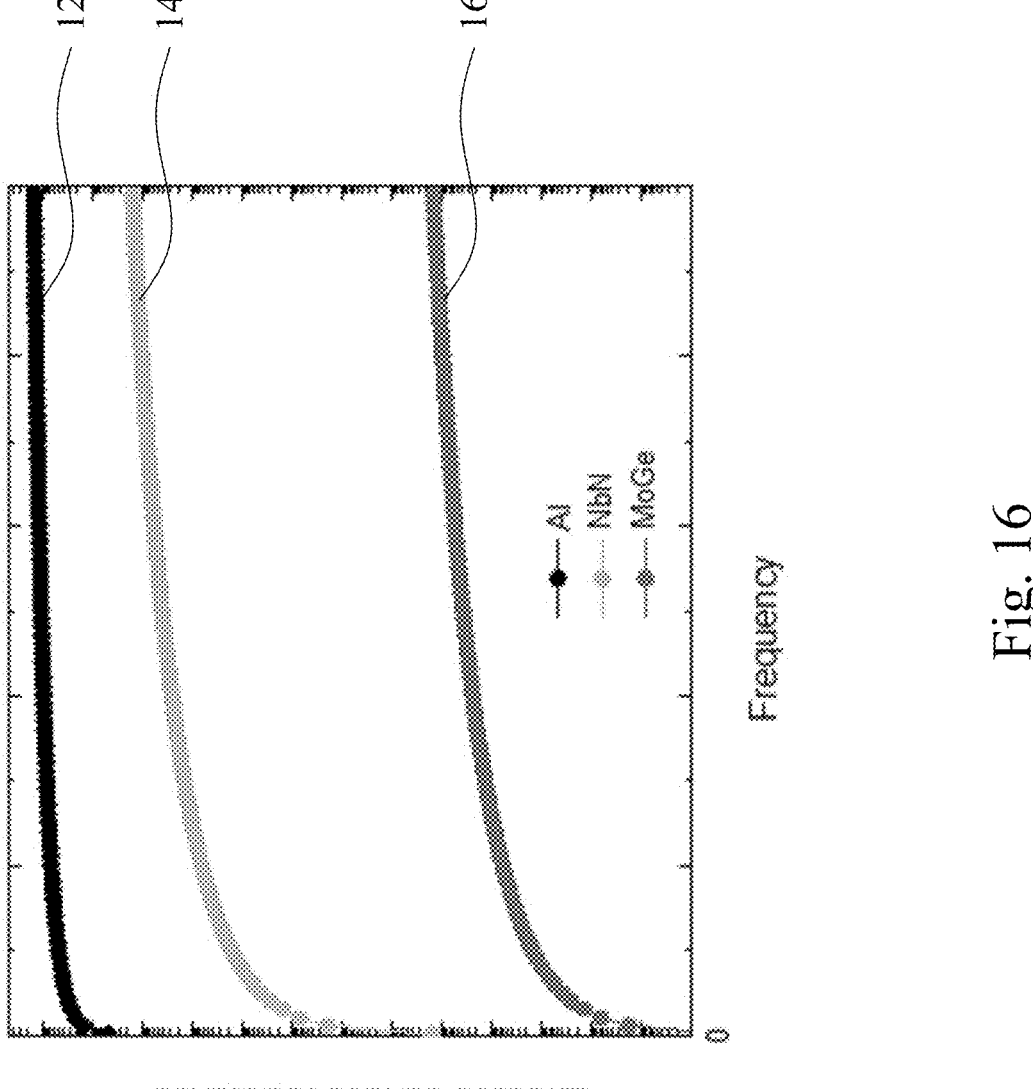
FIG. 16 shows simulated effective surface resistances versus frequency of different materials according to some embodiments of the present disclosure.

FIG. 16 shows simulated effective surface resistances versus frequency of different materials according to some embodiments of the present disclosure. In FIG. 16, line 12 represents the simulated effective surface resistances of aluminum in a normal state, line 14 represents the simulated effective surface resistances of NbN in a superconductive state, and line 16 represents the simulated effective surface resistances of MoGe in a superconductive state.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the superconductive resonator improves the local heating issues near the quantum dot qubit region. Another advantage is that microwave sources with a wide range of the Rabi frequencies can be applied to the devices, and the application of the devices is enhanced.

According to some embodiments, a device includes a source region, a drain region, a channel region, a pair of depletion gates, an accumulation gate, and a superconductive resonator. The channel region is between the source region and the drain region. The depletion gates are spaced apart from each other. The depletion gates both overlap the channel region and define a quantum dot qubit region in the channel region and between the pair of depletion gates. The accumulation gate is above and crossing the pair of depletion gates. The superconductive resonator is laterally adjacent the quantum dot qubit region.

According to some embodiments, a device includes a source region, a drain region, a channel region, a conductive resonator, a pair of depletion gates, and an accumulation gate. The source region and the drain region are on opposite sides of the channel region. The conductive resonator is over the substrate and has a linear portion adjacent the channel region in a top view. The pair of depletion gates is over the channel region and extend along a direction non-parallel with the linear portion of the conductive resonator in the top view. The pair of depletion gates defines a quantum dot qubit region in the channel region. The accumulation gate covers the pair of depletion gates and the quantum dot qubit region. The accumulation gate is made of a superconductive material.

According to some embodiments, a method includes forming a channel region, a source region, and a drain region in a substrate. A superconductive layer is deposited over the substrate to cover the channel region, the source region, and the drain region. The superconductive layer is patterned to form a pair of depletion gates crossing the channel region. An accumulation gate is formed over the pair of depletion gates and covers the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a channel region, a source region, and a drain region in a substrate;
depositing a superconductive layer over the substrate to cover the channel region, the source region, and the drain region;
patterning the superconductive layer to remove a portion of the superconductive layer covering the channel region to form a conductive resonator over the substrate and spaced apart from the channel region in a top view; and
forming an accumulation gate over the conductive resonator and covering the channel region.

2. The method of claim 1, further comprising forming a pair of depletion gates adjacent the conductive resonator.

3. The method of claim 2, wherein a thickness of the accumulation gate is greater than a thickness of the conductive resonator.

4. The method of claim 2, wherein a superconducting transition temperature of the conductive resonator is higher than a superconducting transition temperature of the pair of depletion gates.

5. The method of claim 1, wherein the accumulation gate is a type II superconductor.

6. The method of claim 1, wherein the conductive resonator is single crystalline.

7. A method comprising:
forming a source region, a drain region, and a channel region in a substrate, wherein the channel region is between the source region and the drain region;
forming a pair of depletion gates spaced apart from each other, wherein the pair of depletion gates both overlap the channel region and define a quantum dot qubit region in the channel region and between the pair of depletion gates; and forming a superconductive resonator laterally adjacent the quantum dot qubit region and outside a region between the pair of depletion gates in a top view.

8. The method of claim 7, wherein the superconductive resonator is a type II superconductor.

9. The method of claim 7, wherein the superconductive resonator is single crystalline.

10. The method of claim 7, wherein a superconducting transition temperature of the superconductive resonator is higher than a superconducting transition temperature of the pair of depletion gates.

11. The method of claim 7, further comprising forming an accumulation gate above and crossing the pair of depletion gates.

12. The method of claim 11, wherein a lateral distance between the superconductive resonator and the accumulation gate is in a range from about 15 nm to about 50 nm.

13. The method of claim 7, wherein a thickness of the superconductive resonator is in a range from about 40 nm to about 100 nm.

14. A method comprising:

forming a source region, a drain region, and a channel region in a substrate, wherein the source region and the drain region are on opposite sides of the channel region;

forming a conductive resonator over the substrate and having a linear portion adjacent the channel region in a top view and extending along a first direction;

forming a pair of depletion gates over the channel region, arranged in the first direction, and extending along a second direction non-parallel with the first direction of the linear portion of the conductive resonator in the top view, wherein the pair of depletion gates defines a quantum dot qubit region in the channel region; and forming an accumulation gate covering the pair of depletion gates and the quantum dot qubit region, wherein the accumulation gate is made of a superconductive material and is spaced apart from the conductive resonator in a top view, and a length of the conductive resonator is greater than a distance between the pair of depletion gates in the first direction.

15. The method of claim 14, wherein the accumulation gate comprises MoGe, NbN, Nb$_3$Sn, or combinations thereof.

16. The method of claim 14, wherein the conductive resonator comprises MoGe, NbN, Nb$_3$Sn, or combinations thereof.

17. The method of claim 14, wherein the length of the linear portion of the conductive resonator is greater than a length of the accumulation gate in the top view.

18. The method of claim 14, wherein the length of the conductive resonator is in a range from about 500 nm to about 800 nm.

19. The method of claim 14, wherein a superconducting transition temperature of the accumulation gate is higher than a superconducting transition temperature of the pair of depletion gates.

20. The method of claim 14, wherein a thickness of the accumulation gate is greater than a thickness of the pair of depletion gates.

* * * * *